United States Patent [19]

Gurry

[11] 4,319,334

[45] Mar. 9, 1982

[54] FREQUENCY SENSING DEVICE FOR REDUCING NON-PERIODIC COMPONENTS

[76] Inventor: George W. Gurry, 3 Highfield Close, Danbury, Essex, England

[21] Appl. No.: 89,262

[22] Filed: Oct. 26, 1979

[30] Foreign Application Priority Data

Oct. 27, 1978 [GB] United Kingdom ............... 42202/78

[51] Int. Cl.³ .................. G06F 15/20; G06F 15/336; H04B 15/00
[52] U.S. Cl. ............................. 364/574; 340/825.71; 364/484; 364/728
[58] Field of Search .................... 340/171 R; 364/484, 364/574, 728

[56] References Cited

U.S. PATENT DOCUMENTS

| | | | |
|---|---|---|---|
| 3,855,575 | 12/1974 | Leuschner et al. | 340/171 R X |
| 3,882,303 | 5/1975 | Linder | 364/484 |
| 4,021,653 | 5/1977 | Sharp et al. | 340/171 R X |
| 4,024,414 | 5/1977 | Gurry | 364/484 X |
| 4,064,488 | 12/1977 | Chapman | 340/171 R |
| 4,071,903 | 1/1978 | Head et al. | 364/728 |
| 4,177,453 | 12/1979 | Collins | 340/171 R X |
| 4,211,897 | 7/1980 | Ichikawa et al. | 364/728 |

*Primary Examiner*—Felix D. Gruber
*Attorney, Agent, or Firm*—Browdy and Neimark

[57] ABSTRACT

A device for sensing the frequency of an alternating electrical input signal. An autocorrelator at an input to the device generates a signal having a periodic component of frequency equal to four times the frequency of any periodic component in the input signal. The amplitude of non-periodic components is substantially reduced. The autocorrelator is followed by a series of sixteen frequency dividers whose outputs are applied to respective comparators. Within each comparator the signal from a divider is compared with one of sixteen window signals, each representing a predetermined range of periods. Any output from the comparator is converted to a binary decimal form and is applied to a qualifier circuit. The qualifier circuit only gives an output if at least eleven of the last eighteen signals applied thereto have represented a signal whose period lies within the same one of the predetermined ranges of periods.

31 Claims, 8 Drawing Figures

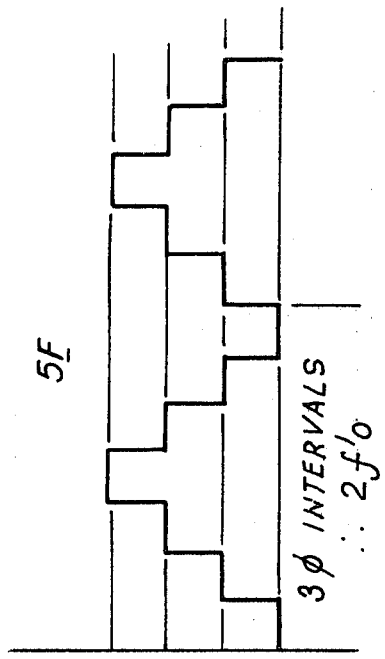
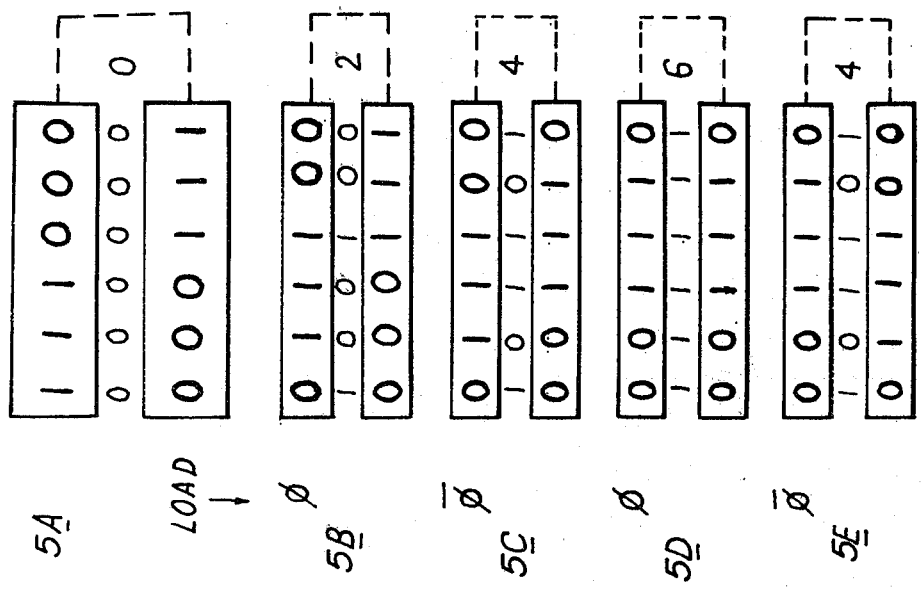
FIG. 5

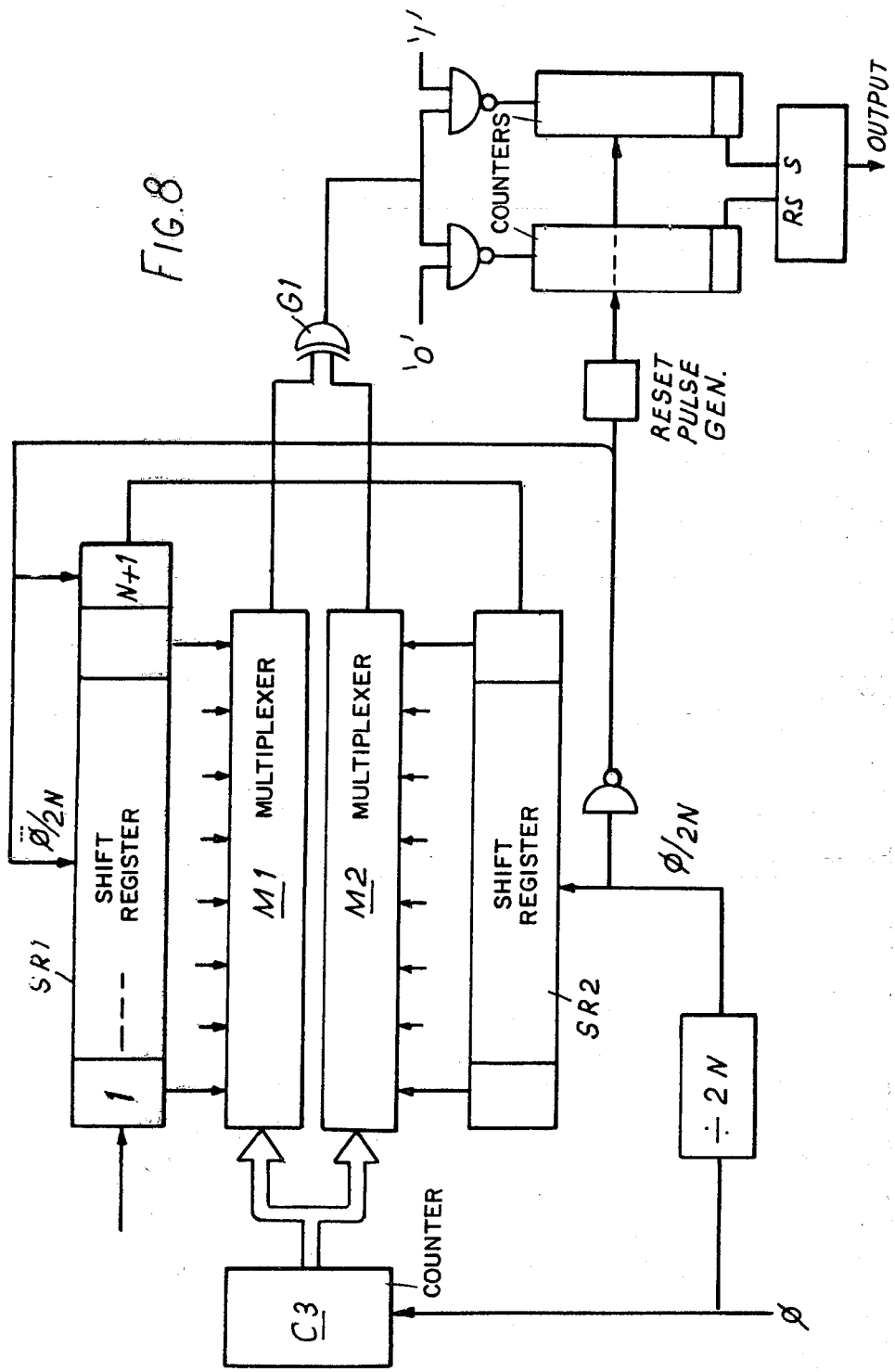

FREQUENCY SENSING DEVICE FOR REDUCING NON-PERIODIC COMPONENTS

BRIEF SUMMARY OF THE INVENTION

This invention relates to frequency sensing devices.

According to the invention a device for use in sensing the frequency of an electrical signal comprises autocorrelation means which comprise storage means, the storage means comprising a series of stages for storing information representing successive values in time of an electrical parameter of an alternating input signal applied thereto, means which are adapted, in the interval between the entry into the storage means of information representing one value of the electrical parameter and the entry of information representing the immediately succeeding value, to generate a series of comparison signals, each comparison signal being a logic level representing a comparison between information stored at a pair of associated stages in the storage means, and means for generating from each series of comparison signals an output representing a sum of the comparison signals in the series, the stages in the storage means being so associated together in pairs and the comparisons being such that there is generated at the output of the generating means an output signal having a periodic component whose period is equal to half the period of a periodic component in the input signal and having substantially fewer non-periodic components than the input signal, and means for applying an incoming electrical signal or a signal which represents successive values in time of an electrical parameter of the incoming signal to the input of the autocorrelation means, whereby there is generated at the output of the autocorrelation means a signal having a periodic component whose period represents the period of a periodic component in the incoming electrical signal and having substantially fewer non-periodic components than the incoming electrical signal.

The device may further comprise means defining an interval of time representing a predetermined range of periods, means for comparing the period of the periodic component of the output signal from the autocorrelation means with that interval of time and generating outputs respectively representative of a period of a periodic component of the output signal from the autocorrelation means which lies within or without the predetermined range of periods, and means for applying outputs of the comparator means to a qualifier circuit which is adapted to produce a predetermined output signal only if a first predetermined number of successive outputs applied to the qualifier circuit from the comparator means include a second predetermined number of predetermined outputs.

BRIEF DESCRIPTION OF THE DRAWINGS

The invention will now be described, by way of example, with reference to the accompanying drawings, in which:

FIG. 5, including A–F, shows diagrammatically the generation of an output signal by the circuit of FIGS. 2 and 3;

FIG. 8 is an alternative form of autocorrelation circuit for the device of FIG. 1.

DETAILED DESCRIPTION

FIGS. 1 to 7 of the drawings show a device for detecting and identifying a periodic component in an incoming electrical signal which has a frequency equal to any one of sixteen predetermined frequencies in the range of audio frequencies from 500 Hz to 3 KHz. The device is capable of detecting such a component in the presence of high noise levels, for example a signal-noise ratio of 0 dB.

Figure 1:
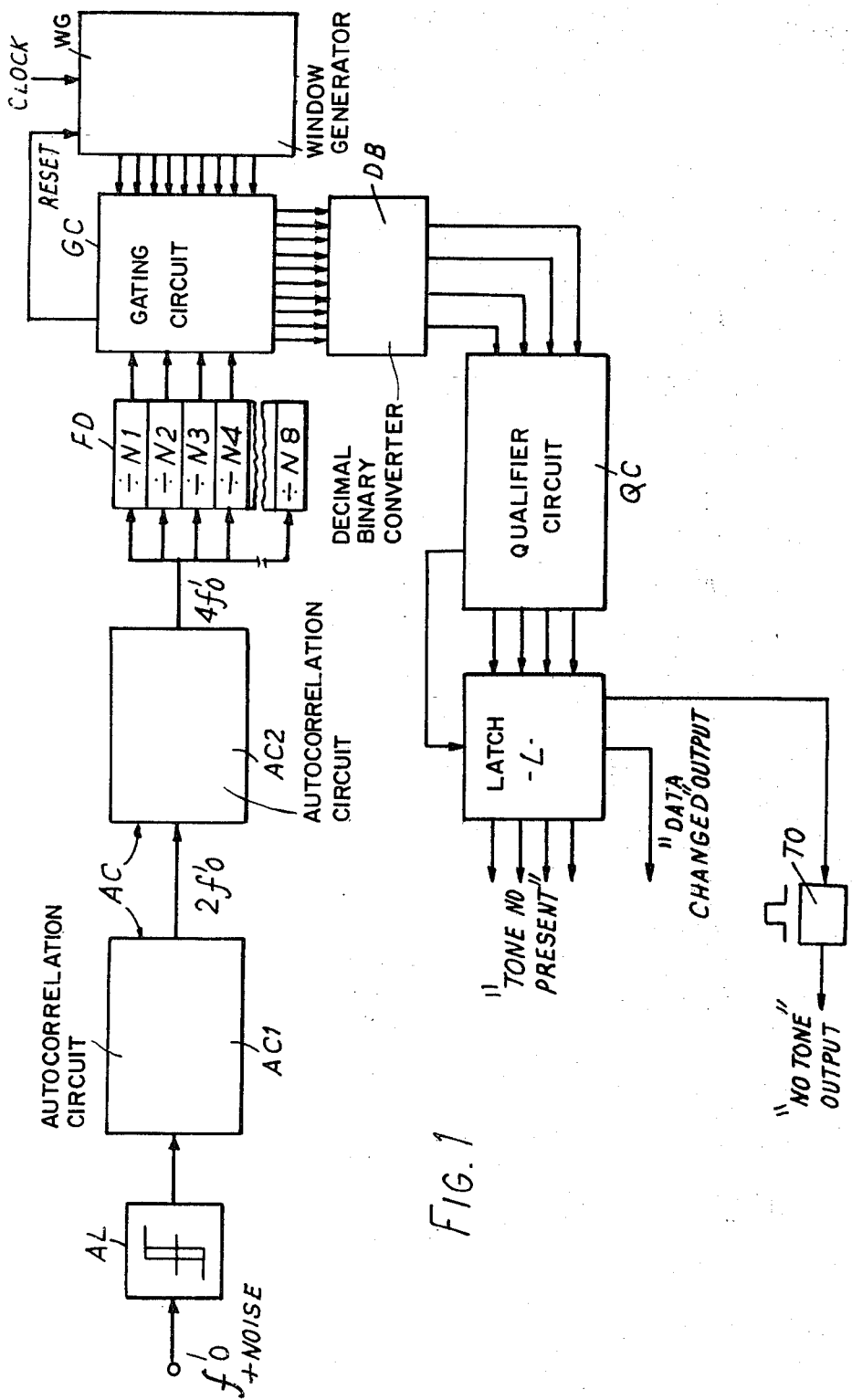
FIG. 1 is a block schematic drawing of a frequency sensing device according to the invention.

Referring to FIG. 1, the present device includes first an amplifier-limiter AL for generating logic signals which represent successive values in time of the polarity of the incoming signal. Autocorrelation means AC are arranged to process the logic signals and to produce an autocorrelated signal having a periodic component whose period equals one quarter of the period of any periodic component in the incoming signal. The autocorrelated signal includes substantially fewer non-periodic components than the incoming signal. At the output of the autocorrelation means AC are frequency dividers FD which produce a series of signals, each having a period equal to a predetermined multiple of the period of the periodic component in the autocorrelated signal.

A window generator WG is arranged to provide a series of sixteen window signals each of which defines an interval of time representing a predetermined range of periods.

The outputs from the frequency dividers FD and the window generator WG are connected to a gating circuit GC which compares the period of each signal from the frequency dividers FD with the range of periods represented by an associated window signal and produces an output signal if there is a correspondence between any pair of associated signals. A decimal-binary converter DB is provided for converting output signals from the gating circuit GC into binary form.

At the output of the decimal-binary converter DB is a qualifier circuit QC which examines the signals derived from the gating circuit GC. The qualifier circuit QC is designed to generate an output only if eleven of eighteen immediately preceding signals from the gating circuit GC each represent a correspondence between the same pair of associated signals.

Figure 2:
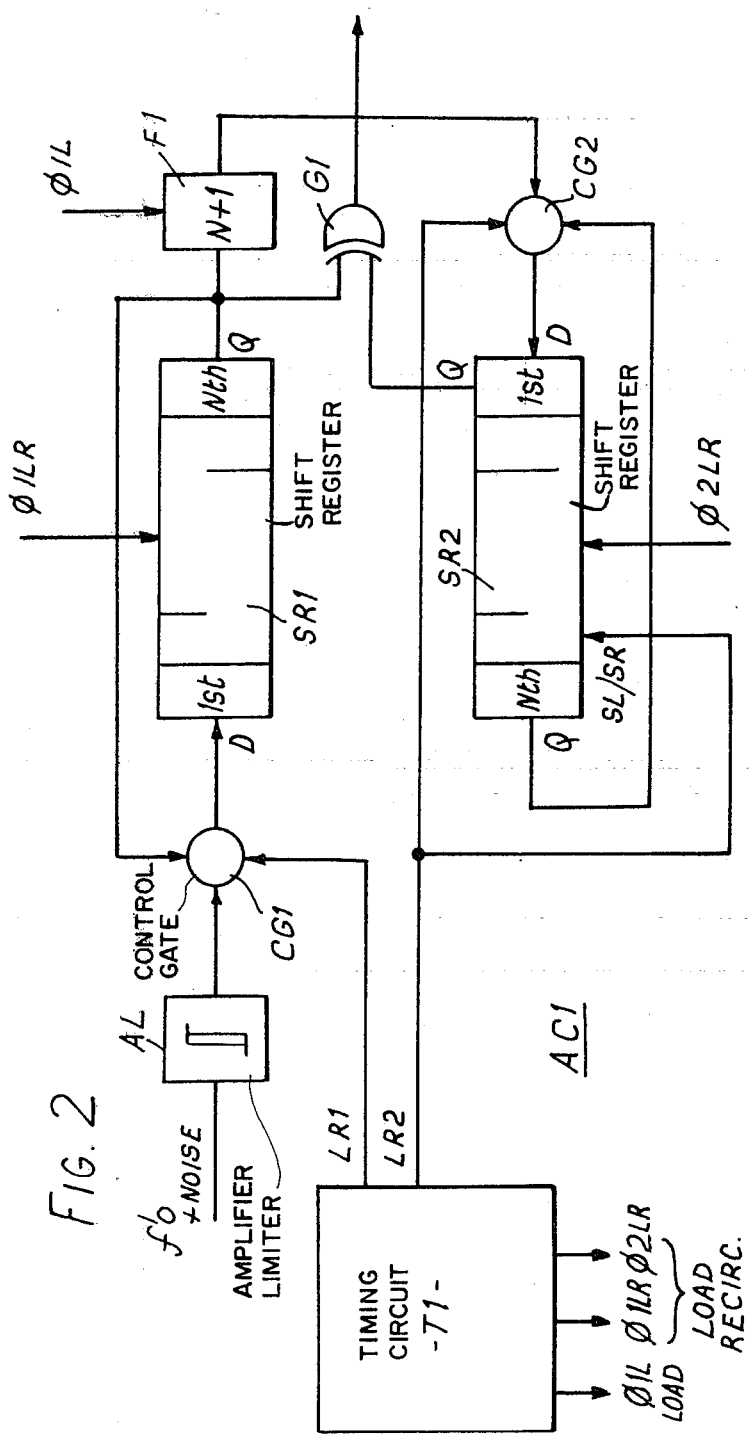
FIGS. 2 and 3 are block schematic drawings of an autocorrelation circuit in the device of FIG. 1.

In more detail, and referring to FIGS. 1 and 2, the circuit AL at the input to the present device is an amplifier-limiter formed by a Schmitt trigger circuit. The circuit produces a sample signal which has square wave form and an amplitude which assumes one of two predetermined logic levels, according to the amplitude and polarity of an incoming signal.

Connected to the output of the amplifier-limiter AL is a first autocorrelation circuit AC1 made up of an autocorrelator and a digital Schmitt trigger output circuit. This first autocorrelation circuit AC1, which is shown in more detail in FIG. 2, converts a periodic component in an incoming signal into a component of frequency equal to twice the frequency of the incoming component. There is also a substantial reduction in the noise level.

At the input to the first autocorrelation circuit AC1 there is a first control gate CG1 which has an input connected to the output of the amplifier-limiter AL and an output connected to a first stage of a 40-stage shift register SR1. An output of a final stage in this first register SR1 is connected via a "carry" flip-flop F1 and a second control gate CG2 to a first stage in a second 40-stage register SR2, which is a reversible shift register.

As hereinafter described, autocorrelation involves making a series of comparisons, in each of which each bit of information in one of the registers SR1 and SR2 is compared with a corresponding bit in the other register. One series of comparisons is made in the interval of time between the entry of a fresh bit into the first register SR1 and the transfer of a bit from the final stage to the "carry" flip-flop F1 and the subsequent transfer of the bit from the "carry" flip-flop F1 to the second register SR2. Another series of comparisons takes place in the interval of time between a bit being transferred from the "carry" flip-flop F1 to the second register SR2 and the subsequent application of a fresh bit to the first register SR1. To make the comparisons a multiplexing operation is performed. In this multiplexing operation all of the bits in each of the registers SR1 and SR2 are recirculated and two corresponding bits are compared when they are located in the final stage of the first register SR1 and the first stage of the second register SR2, respectively.

To enable the comparisons to be made, the output of the final stage in the first register SR1 and the output of the first stage in the second register SR2 are connected to respective inputs of an exclusive/OR gate G1. Additionally, the output of the final stage in the first register SR1 is connected to a second input of the first control gate CG1 and an output of the final stage in the second register SR2 is connected to a second input of the second control gate CG2.

For loading bits into the registers SR1 and SR2, recirculating bits already in the registers, and operating the two control gates CG1 and CG2, the first autocorrelation circuit AC1 is provided with a timing circuit T1. The timing circuit T1 includes a clock pulse generator, frequency dividers and logic circuits (not shown) which supply a series of synchronised output signals to the other parts of the circuit. Three of these output signals are clock signals, $\phi 1$ load ($\phi 1L$), $\phi 1$ load/recirculate ($\phi 1LR$) and $\phi 2$ load/recirculate ($\phi 2LR$), and two are control signals, load/recirculate 1 (LR1) and load/recirculate 2 (LR2).

As hereinafter described, an output of the timing circuit T1 which supplies the clock signal $\phi 1LR$ is connected to a clock input of the first shift register. The signal $\phi 1LR$ consists of a train of pulses, loading pulses for loading bits into the register and, between each successive pair of loading pulses, a series of recirculation pulses for recirculating bits in the register. An output of the timing circuit which supplies the control signal LR1 is connected to the first control gate CG1, which determines whether the connections at the input to the first register SR1 are those required for loading or recirculation. The clock signal $\phi 1L$ is associated witht the signal $\phi 1LR$ and consists of pulses for loading bits from the final stage of the first register SR1 into the "carry" flip-flop F1.

An output of the timing circuit which supplies the clock signal $\phi 2LR$ is connected to a clock input of the second register SR2 and supplies loading and recirculation pulses to that register. An output which supplies the control signal LR2 is connected to the second control gate CG2, which determines whether the connections to the second register SR2 are suitable for loading or recirculation, and to a further input to the second register SR2, where the signal LR2 causes the register to operate in the reverse direction during recirculation.

The timing circuit T1 includes inhibiting circuits (not shown) which prevent the generation of a pulse at the output which supplies the clock signal $\phi 2LR$ when a loading pulse is being generated a the output which supplies the signal LR1. Likewise there is no loading or recirculation pulse from the output supplying the signal LR1 and no loading pulse in the signal $\phi 1L$ at the time when there is a loading pulse in the signal $\phi 2LR$.

Figure 3:
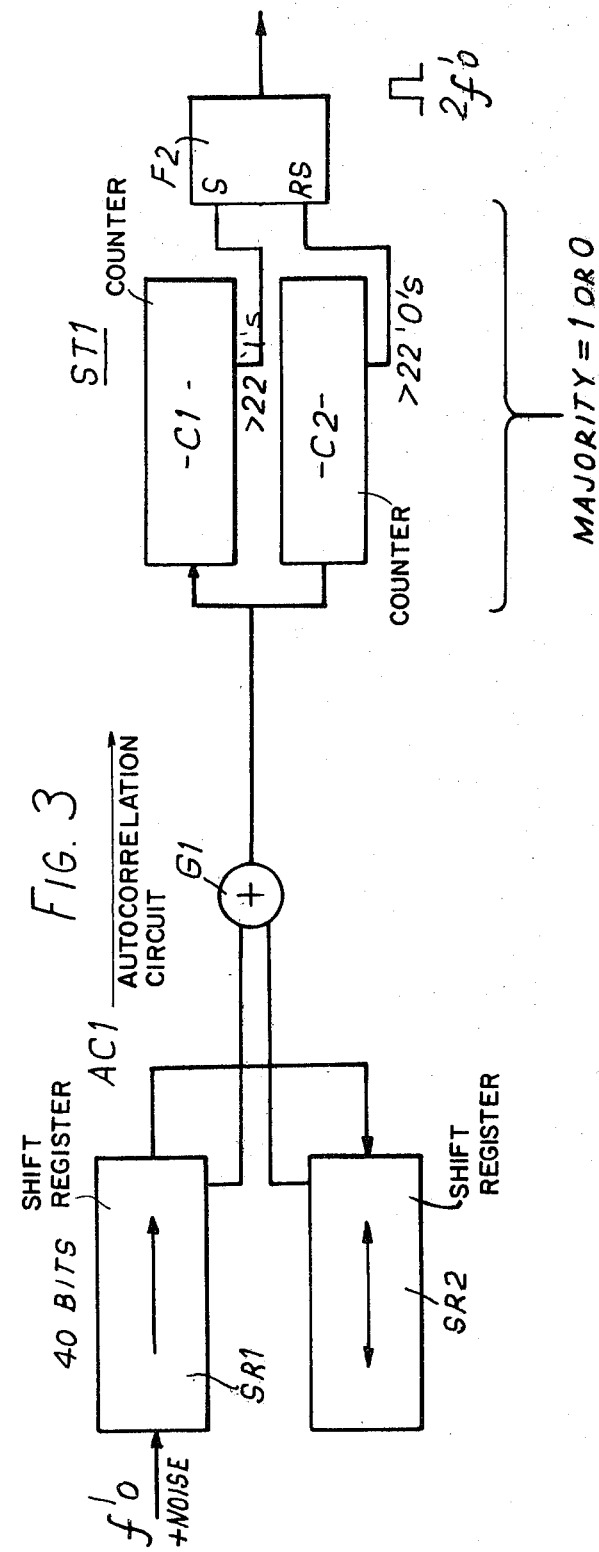

Referring to FIG. 3, an output of the exclusive/OR gate G1 in the autocorrelation circuit AC1 is connected to the inputs of two 22-stage counters C1 and C2 in a Schmitt trigger output circuit ST1. The counter C1 is designed to count the number of times during each recirculation of bits in the shift registers a logic 1 voltage appears at the output of the exclusive/OR gate G1. The second counter C2 counts the number of logic 0 voltages. An output flip-flop F2 has a "set" input thereof connected to the final stage in the first counter C1 and a "reset" input connected to the final stage in the second counter C2.

An output from the Schmitt trigger output flip-flop F2 in the first autocorrelation circuit AC1 is connected to the input of the second autocorrelation circuit AC2. This second circuit AC2, which is not shown in detail, is similar in construction to the circuit AC1, being made up of an autocorrelator circuit and a Schmitt trigger output circuit. It will be appreciated, however, that since any periodic component in the signal applied to the second autocorrelation circuit AC2 has twice the frequency of a corresponding component in the incoming signal, the frequencies of clock signals and control signals generated in the second autocorrelation circuit AC2 are equal to twice the frequencies of corresponding signals in the first autocorrelation circuit AC1.

Figure 6:
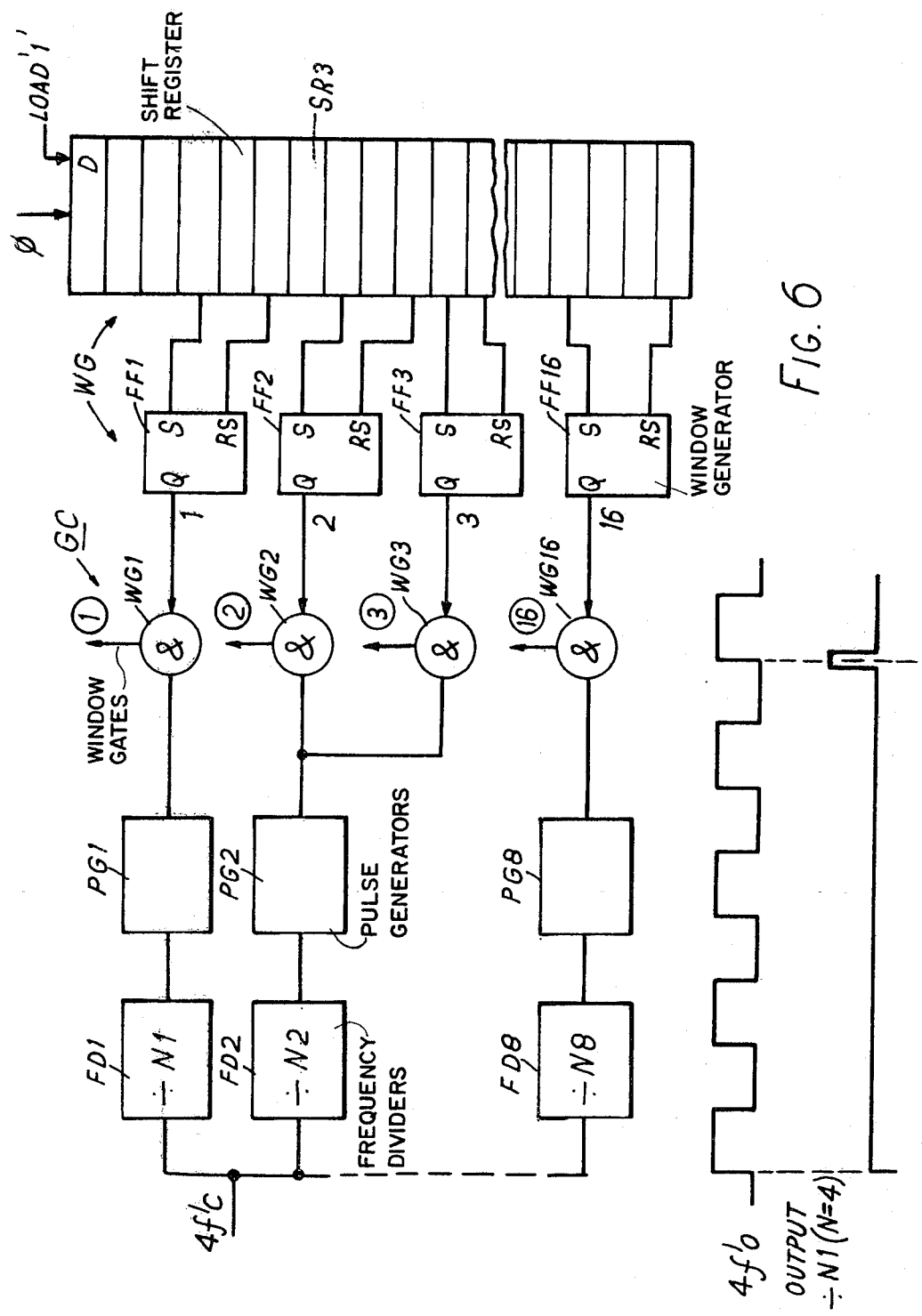
FIG. 6 is a block schematic drawing of gating circuits and a window generator in the device of FIG. 1.

Referring to FIG. 6, the output from the second autocorrelation circuit AC2 is connected to the inputs of eight frequency dividers FD1 to FD8 in the circuit FD. Each of the dividers FD1 to FD8 is designed to generate a signal which has the form of a square wave and a frequency equal to a predetermined fraction of the frequency of a signal supplied thereto from the second autocorrelation circuit. As mentioned above, the present circuit is intended to detect incoming periodic signals, whose frequencies range from 500 Hz to 3 KHz. Such incoming signals result in signals of frequency from 2 KHz to 12 KHz at the output of the second autocorrelation circuit. The frequency dividers FD1 to FD8 are arranged to divide the frequencies of signals applied thereto by factors which vary from 4 to 24. This means that for any incoming signal within the above range of incoming frequencies there will be an output from at least one of the dividers FD1 to FD8 which has a frequency of approximately 500 Hz, i.e., a period of approximately 2 ms.

Each of the eight frequency dividers FD1 to FD8 has its output coupled to a respective one of eight pulse generators PG1 to PG8, which is designed to generate a short positive-going pulse at the end of a cycle of the output signal from the associated divider.

The outputs of the eight pulse generators PG1 to PG8 are connected to a series of sixteen "window" gates WG1 to WG16 in the gating circuit GC referred to above. Each "window" WG1 to WG16 gate is an AND-gate. In some cases an output of a pulse generator PG1 to PG8 is connected to an input of two or more of the "window"0 gates WG1 to WG16, in the remaining cases there is a connection from a pulse generator to one "window" gate only.

The "window" generator WG associated with the gating circuit GC includes a shift register SR3 and a series of sixteen flip-flops FF1 to FF16. Each of the flip-flops FF1 to FF16 has a "set" input connected to a predetermined associated stage in the shift register SR3 and a "reset" input connected to a subsequent stage in the register. A Q output of each flip-flop FF1 to FF16 is connected to a second input of a respective one of the sixteen "window" gates WG1 to WG16.

A logic 1 voltage is applied to an input of the first stage in the shift register SR3 of the window generator WG and a clock input to the register is connected to a clock pulse generator (not shown) which is enabled when all of the dividers FD1 to FD8 are commencing an output cycle. This generator applies clock pulses to the register SR3 at a frequency of 96 KHz. Each of the clock pulses causes a single logic 1 bit to be advanced through the register SR3. The states in the register SR3 which are connected to the "set" and "reset" inputs of the sixteen flip-flops FF1 to FF16 referred to above are so arranged that the time of arrival of the logic 1 bit at the first of the stages is in the ration 1:1.5 as compared with the time of arrival at the last of the stages.

The outputs of the sixteen "window" gates WG1 to WG16 are connected to respective inputs of the decimal-binary converter DB having four output lines.

Figure 7:
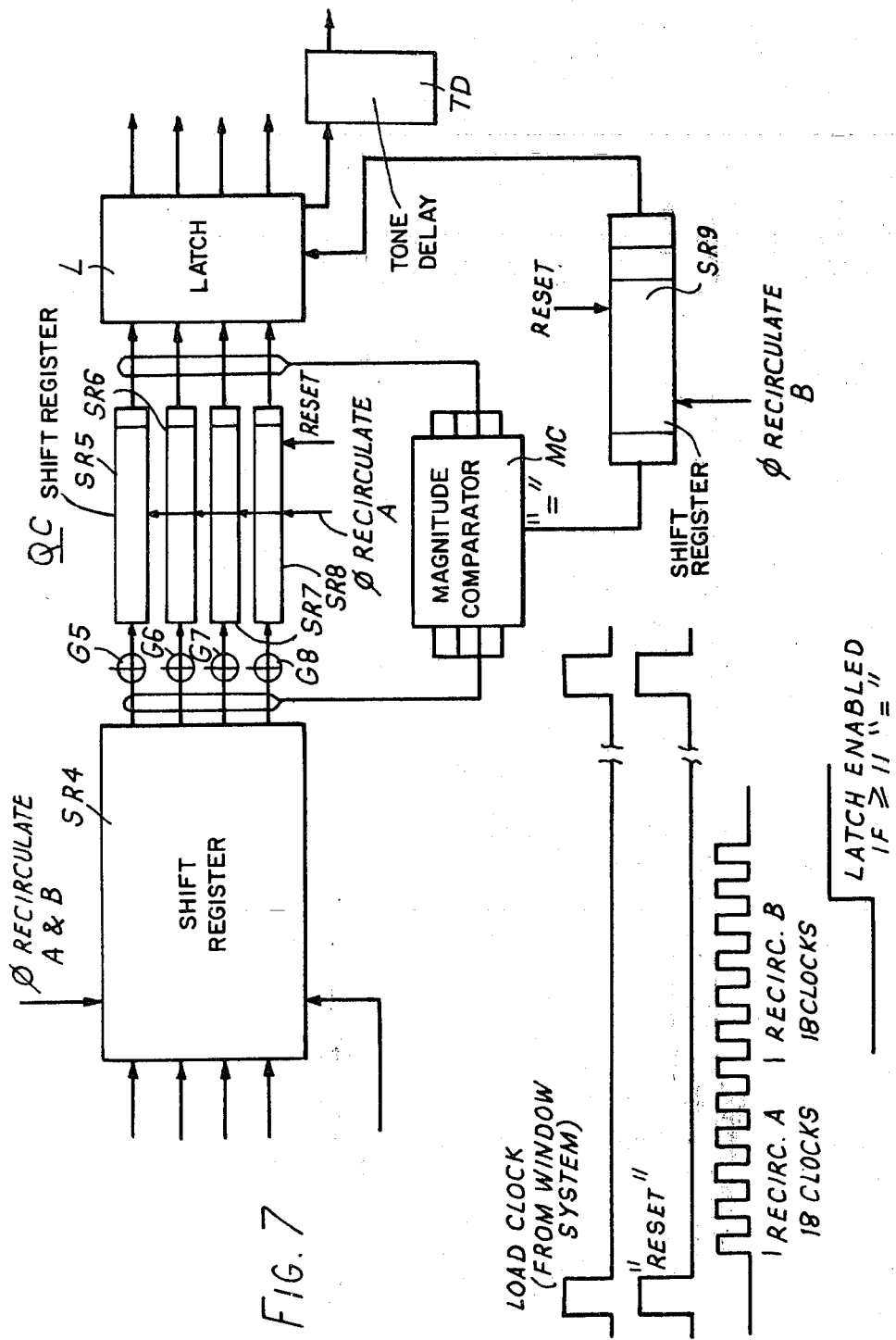
FIG. 7 is a block schematic drawing of a qualifier circuit in the device of FIG. 1.

Referring now to FIG. 7, the qualifier circuit QC includes an 18×4 bit shift register SR4 which has its four inputs connected to respective output lines from the decimal-binary converter DB. At the output of the register SR4 are four exclusive/OR gates G5 to G8, each having one input connected to an associated output of the register and a second input which is supplied with a logic 1 voltage. Four 11-bit registers SR5 to SR8 are connected to respective outputs of the exclusive-/OR gates G5 to G8 and an output latch L is connected to the output of the four registers.

As hereinafter described, operation of the qualifier circuit QC involves making a comparison between bits of information at the output of the 18×4 register SR4 and bits at the outputs of the four 11-bit registers SR5 to SR8. The comparison is effected by means of a magnitude comparator MC which has one set of four inputs connected to the 18×4 bit register SR4 and a second set of four inputs connected to the 4×11 bit registers SR5 to SR8. An output of the magnitude comparator MC is connected to a further 11-bit register SR9. Outputs from the latch L are connected to a tone delay TD.

The qualifier circuit QC must be operated in synchronism with the "window" generator WG and clock signals for loading bits of information into the registers SR4 to SR9 and recirculating bits already in the registers are derived from the clock pulse generator referred to above. Included in the clock signals there is first a train of clock pulses for loading a four bit word on the output lines from the decimal-binary converter DB into the 18×4 bit shift register SR4. This first train of pulses is also used for resetting the four 11-bit registers SR5 to SR8. Secondly, there is a train of pulses which are used for recirculating bits in the registers SR4 to SR8. The second train is formed of series of thirty six pulses, there being one series between each successive pair of loading pulses. In each series the first eighteen pulses are used to recirculate bits in the registers SR4 to SR8 whilst the second eighteen pulses are used to recirculate bits in the 18×4 bit register SR4 only. These second eighteen pulses also serve as clock pulses for the final 11-bit register SR9.

When the present device is in use, an incoming electrical signal is applied to the input of the amplifier-limiter AL and a signal of square wave form is produced at the output thereof. As described above, the signal has an amplitude which assumes a first logic level when the incoming signal has a positive polarity and a second logic level when the signal has a negative polarity. As also described, the output of the amplifier limiter AL is connected to the first control gate CG1 in the first autocorrelation circuit AC1.

In the first autocorrelation circuit AC1 each loading pulse in the clock signal $\phi 1LR$ for the first shift register SR1 occurs at the same instant in time as an associated loading pulse in the clock signal $\phi 1L$ is applied to the "carry" flip-flop F1. Moreover, these loading pulses occur whilst the control signal LR1 has operated the first control gate CG1 so that the output of the amplifier limiter AL is connected to the first stage in the register SR1. Accordingly, each pair of associated loading pulses serves to load a fresh bit, representing the logic level of the output from the amplifier-limiter AL, into the first stage of the register SR1, to advance by one stage the bits already in the register SR1, and to load the bit in the final stage into the "carry" flip-flop F1. Loading is effected at a frequency of 12 KHz.

Each loading pulse in the clock signal $\phi 2LR$ applied to the second shift register SR2 occurs whilst the control signal LR2 has operated the second gate CG2 so that the output of the "carry" flip-flop F1 is connected to the first stage of the second register SR2. Accordingly, each loading pulse causes the bit in the "carry" flip-flop F1 to be loaded into the first stage of the second shifr register SR2. The loading pulses in the clock signal $\phi 2LR$ have a frequency of 12 KHz and each pulse occurs midway between a pair of successive loading pulses in the clock signal $\phi 1LR$.

It will be appreciated that clock signals at 12 KHz are sufficient to fully load the first and second shift registers SR1 and SR2, respectively, after a few cycles of a component of an incoming signal of frequency between 500 Hz and 3 KHz.

In the interval of time between each loading pulse in a clock signal $\phi LR1$ or $\phi LR2$ and the next succeeding loading pulse in the other clock signal, there are forty recirculation pulses. During the time when the recirculation pulses are generated the control signals LR1 and LR2 operate the first and second control gates CG1 and CG2, respectively, so that an output from the first stage in each register is connected to an input in the final stage of the register. Moreover, the control signal LR2 actuates the second shift register SR2 so that this register operates in the reverse direction. In the result, all of the bits in each register SR1 and SR2 are recirculated via the associated control gate CG1 or CG2, in the forward direction in the case of the first register SR1 and in the reverse direction for the second register SR2.

Figure 4:
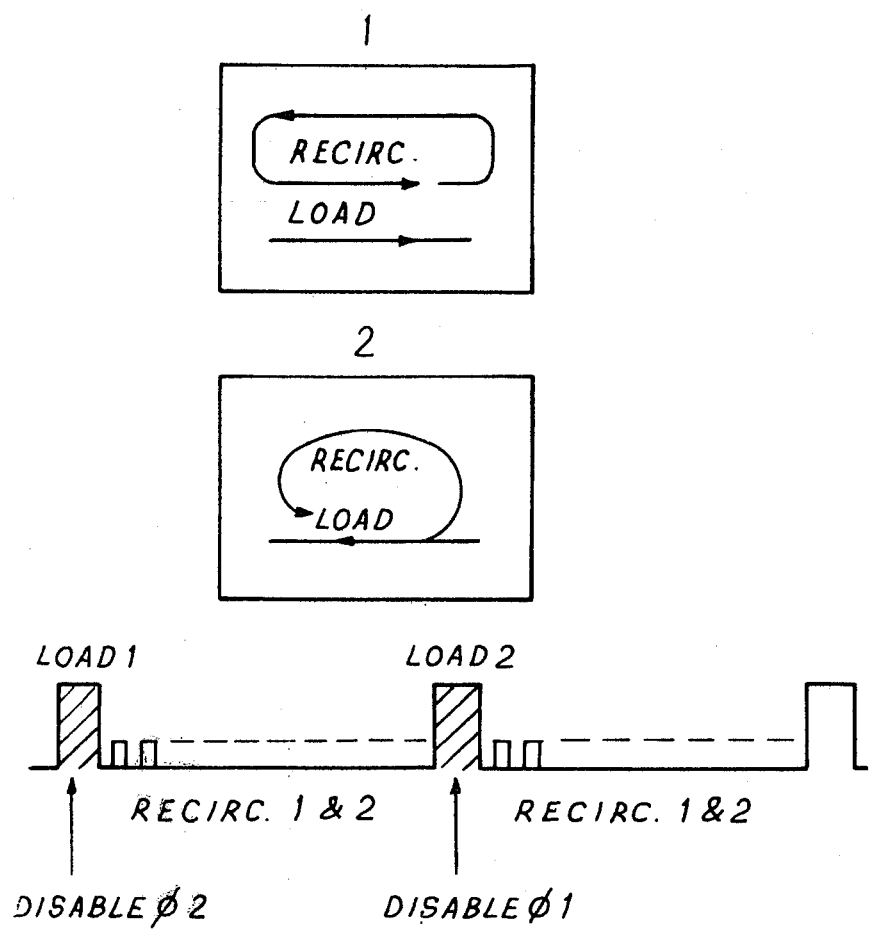
FIG. 4 shows diagrammatically loading and recirculation pulses generated in the autocorrelation circuit of FIGS. 2 and 3.

FIG. 4 shows diagrammatically the loading of pulses into the registers SR1 and SR2 and the recirculation of pulses in the registers. Also shown are the loading and recirculation pulses.

As described above, an output of the final stage in the first register SR1 and an output of the first stage in the second register SR2 are connected to respective inputs of the exclusive/OR gate G1. This means that immediately after a loading pulse has been applied to one or other registers SR1 and SR2, and before the first recirculation pulse is generated, there are voltages at the inputs to the exclusive/OR gate G1 which correspond to the bits in the final stage of the first register SR1 and the first stage in the second register SR2, respectively. If the two bits are the same, i.e. both are a logic 1 or 0, the output of the gate G1 assumes a logic 1 condition. If one bit is a logic 1 and the other a logic 0, the output of the gate G1 becomes a logic 0.

After the first recirculation pulse the bit in the penultimate stage of the first register SR1 is transferred to the final stage and the bit in the second stage of the second register SR2 is transferred to the first stage. Accordingly, the voltages applied to the exclusive/OR gate G1 now represent bits originally in the penultimate stage of the first register SR1 and the second stage of the second register SR2, respectively. As before, the output of the gate G1 assumes a logic 1 condition if the bits are the same and a logic 0 condition if they are different.

After the second recirculation pulse there is likewise a comparison between the bits originally located in the last stage but two of the first register SR1 and the third stage of the second register SR2, and so on for each recirculation pulse. In the result, the output of the exclusive/OR gate G1 assumes in sequence a series of logic conditions each of which represents a comparison between the bit in one stage of the first register SR1 and the bit in the associated stage in the second register SR2.

A component of an incoming signal having a frequency within the range referred to above is sample, say, six times per cycle. This means that during each cycle three logic 1 bits (representing a sample during a positive half cycle) followed by three logic 0 bits (representing a sample during a negative half cycle) are loaded into the registers SR1 and SR2.

FIG. 5A shows diagrammatically the situation when bits representing the end of one cycle are at the end of the first register SR1 and bits representing the previous cycle are at the beginning of the second register SR2. For simplicity, it is assumed that each register SR1 and SR2 contains only six stages. The six stages of the first register SR1 are then loaded with the bits 111000 (in a direction from beginning to end of the register) and the first six stages of the second register SR2 are loaded with 111000 (again in a direction from beginning to end of the register). Each of the six stages in the first register SR1 then holds a different bit from that held by the associated stage in the second register SR2 and the recirculation process leads to a series of six logic 0's at the output of the exclusive/OR gate G1.

If a loading pulse in the clock signal $\phi 1LR$ is now applied to the first register SR1 and the clock signal $\phi 1L$ is applied to the "carry" flip-flop F1, the bit in the final stage of the register SR1 is transferred to the flip-flop F1 and the bit in each of the five preceding stages is advanced to the next stage. There is no change in the bits in the second register SR2. In the result, the bits in the six stages of the first register are 011100 (in the direction from beginning to end) and the bits in the six stages of the second register are still 111000 (again in the direction from beginning to end). This situation is shown in FIG. 5B. The recirculation process now gives two logic 1's and four logic 0's at the output of the exclusive/OR gate.

If a loading pulse in the clock signal $\phi LR2$ is now applied to the second register SR2, the bit in the "carry" flip-flop F1 is transferred to the first stage in the second register SR2 whilst the bits in last six stages of the first register SR1 remain the same. As shown in FIG. 5C the bits in the six stages of the first register SR1 are still 011100, the bits in the six stages of the second register SR2 are 01100, and the recirculation process gives four logic 1's and two logic 0's at the output of the exclusive/OR gate G1.

This process is repeated for each loading pulse. For the first six loading pulses, which occupy an interval of time equal to one cycle of the periodic component of incoming signal, it is found that the number of logic 1's in the sequence of logic conditions at the output of the exclusive/OR gate G1 is 246420246420. The resulting output from the gate G1 is shown in FIG. 5F, from which it will be noted that these sums are varying at a frequency equal to twice the frequency of the incoming component.

In practice, as described above, each of the registers SR1 and SR2 in the first autocorrelation circuit AC1 is a 40-bit register and loading pulses are applied to each register at a frequency of 12 KHz. This means that there are 40 individual bits in the first register SR1 each of which is compared with an associated bit in the second register SR2 and a sequence of 40 logic 0's or 1's at the output of the exclusive/Or-gate G1 for each recirculation process.

Each of the counters C1 and C2 in the Schmitt trigger output circuit ST1 is connected to the exclusive/OR gate G1 and commences counting at the beginning of each recirculation process and ends at the end of the process. The first counter C1 is sensitive to logic 1's at the output of the exclusive/OR gate G1 and generates an output if a count of 22 is reached in any recirculation process (i.e. if there is a majority of logic 1's out of the forty logic conditions applied thereto). The second counter C2 is sensitive to logic 0's and generates an output if a count of 22 is reached (i.e. if there is a majority of logic 0's).

As described above for the simplified case, the number of occasions upon which there is a majority of logic 1's, or logic 0's, varies at a frequency equal to twice the frequency of the periodic component of the incoming signal. Accordingly, the set and reset inputs to the flip-flop F2 connected to the twenty-second stage of each counter C1 and C2 are switched at twice the frequency of the component, as is the output of the circuit AC1.

It will be appreciated that a periodic output signal having a frequency equal to twice the frequency of a periodic component of an incoming signal is obtained for all components whose frequency is not too high for there to be less than two loading pulses per cycle. However, no periodic output signal is produced for signals of randomly varying period, i.e. for a noise signal. This means that the output signal from the autocorrelation circuit AC1 described above has a substantially lower noise level than the incoming signal.

The output signal from the first autocorrelation circuit AC1 is applied to the second autocorrelation circuit AC2. It is there subjected to the same treatment as was the incoming signal in the first autocorrelation circuit AC1, except that the frequencies of the clock and control signals employed in the second circuit AC2 are twice as high as those in the first. At the output of the second autocorrelation circuit AC2 there is therefore generated a signal which has a frequency equal to four times the frequency of a periodic component in the incoming signal. The noise level is still further substantially reduced.

The output signal from the second autocorrelation circuit AC2 is applied to the eight frequency dividers FD1 to FD8 which generate signals having frequencies which range from one quarter to one twenty-fourth of the frequency of the signal applied thereto. Each signal from a divider FD1 to FD8 is applied to the associated pulse generator PG1 to PG8, which produces a single positive-going pulse at the end of each cycle of the signal from the divider.

Pulses from each of the pulse generators PG1 to PG8 are applied to the first input of the or each associated window gate WG1 to WG8 in the gating circuit GC described above.

As described above, clock pulses are applied from the clock pulse generator in the window generator WG to the associated shift register SR3 at a frequency of 96 KHz. In addition, a logic 1 voltage is initially applied to an input to the first stage in the register SR3. The clock pulses cause a single logic 1 bit to be advanced through the register SR3 from stage to stage, as also described, and the logic 1 bit appears in those stages connected to set and reset inputs of the associated flip-flops FF1 to FF16 at predetermined intervals of time after the first clock pulse in a train. The interval of time between a logic 1 bit arriving at a stage which is connected to a set input of one of the flip-flops FF1 to FF16 and the same bit arriving at the stage connected to the reset input of the same flip-flop, when measured relative to the beginning of the train, represents a predetermined range of periods, and hence a predetermined range of frequencies,.

When a logic 1 appears at a stage of the register SR3 which is connected to a set input of a flip-flop FF1 to FF16 the Q output of the flip-flop assumes a logic 1 condition. The Q output remains in that condition until the logic 1 reaches the stage connected to the reset input to the flip-flop, i.e. for the above-mentioned interval representing a predetermined range of periods or frequencies.

Each of the sixteen window-gates WG1 to WG16 has one input connected to an output of the associated pulse generator PG1 to PG8 and a second input connected to the Q output of the associated flip-flop FF1 to FF16. The output of each of the gates WG1 to WG16 is normally in a logic 0 condition but is switched on a logic 1 condition if there is a pulse at the first input to the gate during the interval of time for which there is a logic 1 applied to its second input, i.e. if the frequency of the pulse from the associated pulse generator PG1 to PG8 is within the range of frequencies associated with the gate and the flip-flop FF1 to FF16 and the stage of the register SR3 connected thereto. After a logic 1 bit has been transferred from the final stage of the register SR3 or a logic 1 bit appears at the output of a window gate WG1 to WG16, the register is reset and the outputs of the dividers FD1 to FD8 are reset. At the beginning of the next cycle of the output from the second autocorrelation circuit AC2, each of the frequency dividers FD1 to FD8 commences another cycle and a fresh logic 1 bit is loaded into the shift register SR3 in the window generator WG.

The outputs of the sixteen window gates WG1 or WG16 are applied to respective inputs of the decimal-binary converter DB and the presence of a logic 1 voltage at any input causes a four-bit binary coded signal representing that input to appear at the four output lines from the converter.

As described above, the four output lines from the decimal-binary converter DB are connected to respective inputs of the 18×4 bit shift register SR4 in the qualifier circuit QC. Each four bit word appearing on the output lines is clocked into the register SR4 by a loading signal derived from the clock pulse generator associated with the shift register SR3 in the window generator WG. After an incoming signal including a periodic component has been applied to the present device for a sufficient time the 18×4 bit register SR4 is loaded with eighteen 4-bit words, each representing a component with one of the predetermined ranges of frequency associated with the window generator WG.

As also described above, the clock signals applied to the qualifier circuit QC also include a train of thirty six recirculation pulses between each loading pulse and the next succeeding loading pulse. The first eighteen recirculation pulses are applied to the 18×4 bit register SR4 and to the 4×11 bit registers SR5 to SR8.

In the case of the 18×4 bit register SR4, the effect of each clock pulse is to transfer the 4-bit word in the final stage of the register to the first stage and to advance the word in each of the other stages to the next succeeding stage. Accordingly, the eighteen words are presented in sequence to the exclusive/OR gates G5 to G8 at the output of the register SR4.

Since a logic 1 voltage is permanently applied to one input of each of the exclusive/OR gates G5 to G8, the application of a logic 1 from the register SR4 to the other input of a gate G5 to G8 causes the output of the gate to assume a logic 1 condition. The application of a logic 0 voltage to the other input causes the output of a gate G5 to G8 to be switched to a logic 0. This means that during the course of the first eighteen clock pulses the eighteen 4-bit words in the 18×4 bit register SR4 which are moved in sequence to the final stage and presented to the exclusive/OR gates G5 to G8 appear sequentially at the output of the gates.

As described above, the output of each exclusive/OR gate G5 to G8 is connected to a respective one of four 11-bit shift registers SR5 to SR8. The clock pulses applied to these registers SR5 to SR8 clock each logic 1 which appears at the output of an exclusive/OR gate G5 to G8 into the associated 11-bit register SR5 to SR8. Accordingly, at the end of the first eighteen recirculation pulses any one of the four registers SR5 to SR8 which has been presented with eleven or more logic 1's, has a logic 1 bit in its final stage. Any of the registers SR5 to SR8 which has received less than eleven logic 1 bits has a logic 0 in its final stage. If the bits in the final stages of the four 11-bit registers SR5 to SR8 are then 1010, for example, the only 4-bit word which can have appeared in eleven or more of the eighteen stages in the 18×4 bit register SR4 is the word 1010. There is no guarantee at this stage of course that there were eleven or more occurrences of this word.

The second eighteen pulses in the train of thirty six recirculation pulses are applied to the 18×4 bit register SR4 only. As before, the pulses cause the eighteen 4-bit words in the register SR4 to appear sequentially at the final stage of the register.

As a word appears at the final stage of the 18×4 bit register SR4 the magnitude comparator MC compares the word with the 4-bit word stored in the final stages of the 4×11 bit registers SR5 to SR8. Each time there is a correspondence between the word appearing in the final stage of the 18×4 bit register SR4 and that stored in the final stages of the 4×11 bit registers SR5 to SR8, a logic 1 voltage appears at the output of the comparator MC and is applied from the comparator to the final 11-bit register SR9. The logic 1 voltages are clocked into the final register SR9 by the second eighteen clock pulses.

In the result, a logic 1 bit arrives at the final stage of the final register SR9 if eleven or more of the comparisons referred to above indicate that a 4-bit word in the 18×4 bit register SR4 is the same as the 4-bit word at the outputs of the 4×11 bit registers SR5 to SR8. This means that at least eleven out of the previous eighteen samplings of the incoming signal have detected a periodic component which has a period corresponding to the same one of the sixteen reference periods defined by the window generator WG.

The presence of a logic 1 at the output of the final register SR9 operates the output of the latch L so that the 4-bit word at the output of the 4×11 bit registers is transferred to the output of the latch. This indicates that an incoming signal having a periodic component within the range of reference periods represented by the 4 bit word has been detected. If less than eleven of the previous eighteen samplings represent a period corresponding to the same reference period, the output of the final register SR9 is a logic 0. The application of this logic 0 to the latch L causes a circuit within the latch to operate the "no-tone" delay timer TD. If the logic 0 persists for a predetermined time, set by the timer, a "no-tone" output appears at the output of the timer. If a logic 1 reappears at the output of the register SR9 before the predetermined time has elapsed, the timer TD is reset.

In a modification of the device described above the amplifier limiter AL at the input to the device is replaced by a sampling circuit, for example a delta modulator or other form of sampling analogue-digital converter.

Referring to FIG. 8, the need for recirculating in autocorrelation circuits AC1 and AC2 can be avoided by using a pair of 40 line-1 line multiplexers M1 and M2 in conjunction with the first and second shift registers SR1 and SR2. Each multiplexer M1 and M2 is associated with a respective one of the two registers SR1 and SR2 and has each stage thereof connected to an associated stage in the register. The outputs of the multiplexers M1 and M2 are connected to respective inputs of the exclusive/OR gate G1. At the inputs to the multiplexers M1 and M2 is a counter C3. A timing circuit (not shown) supplies clock pulses to the counter C3 at a frequency $\phi$, loading pulses to the first register SR1 at a rate $\phi/80$, and loading pulses to the second register SR2 at a rate of $\phi/80$. Between the loading of a fresh bit into either register SR1 or SR2 the clock pulses applied to the counter C3 cause scanning pulses to be applied to each multiplexer M1 and M2, whereupon the inputs applied thereto from the forty stages in the associated register SR1 and SR2 appear in sequence at the output of the multiplexers M1 and M2. The result is that an input from one stage of the register SR1 appears at the output of the associated multiplexer M1 at the same time as an input from the associated stage in the other register SR2 appears at the output of the other multiplexer M2. The exclusive/OR gate G1 compares the logic outputs appearing at the outputs of the multiplexers M1 and M2 as described above.

It will be appreciated that not all stages in the registers SR1 and SR2 need be connected to the exclusive/OR gate G1. Those stages not connected serve as a delay. Such a delay could be between the first and second registers SR1 and SR2.

It is not necessary to generate the comparison signals in the autocorrelation circuits AC1 and AC2 serially in time by means of a single gate G1 and a multiplexing operation, as in the circuits shown in FIGS. 2 and 8. Instead, there may be a series of gates, each having a pair of inputs connected to respective stages in a pair of associated stages in the shift registers SR1 and SR2. A circuit is then provided for generating a signal representing the sum of the logic levels appearing simultaneously at the outputs of the gates.

The two counters C1 and C2 of FIG. 3 can be replaced by a single up-down counter which gives an output representing the magnitude and sign of the difference between the number of logic 1's and the number of logic 0's applied thereto.

I claim:

1. A device for generating an electrical signal having a periodic component representative of a periodic component of an electrical input signal and containing fewer non-periodic components than the electrical input signal, the device comprising autocorrelation means having a first series of stages for storing information, means for applying the electrical input signal or a signal representing variation with time of an electrical parameter of the input signal to an input to said autocorrelation means, means for periodically causing information representing the electrical parameter at said input to enter a first stage in said first series of stages and advancing information in each said stage to a respective next succeeding stage, and means which, in the interval of time between each entry of information into said first stage and the next succeeding entry of information, generate a series of comparison signals, each of the comparison signals being a logic level representing a comparison between information stored at a pair of associated stages in said first series of stages, and means for generating from each series of comparison signals an output representing a sum of the comparison signals in the series, said first series of stages being so associated together in pairs and the comparisons being such that there is generated at the output of said generating means an output signal having a periodic component whose period is equal to half the period of a periodic component in the input signal and having substantially fewer non-periodic components than the input signal.

2. A device as claimed in claim 1, wherein the autocorrelation means comprise a shift register in which said first series of stages is located, each stage in the shift register stores information in the form of either one of two logic levels, and the two stages in each pair of associated stages in the register are equidistantly spaced from a predetermined position in the register.

3. A device as claimed in claim 2, wherein the means which generate a series of comparison signals comprise gating means having a pair of inputs which are connected to respective stages in a pair of associated stages, and multiplexer means for successively applying to one input of the gating means information stored in a first of each pair of associated stages and for successively applying to the other input of the gating means information stored in a second of each pair of associated stages, whereby each comparison signal is a first logic level if the logic levels in a pair of associated stages are the same and each comparison signal is a second logic level if the logic levels in a pair of associated stages are different.

4. A device as claimed in claim 3, wherein the means for generating an output representing a sum of the comparison signals comprise two counters each having an input connected to an output of the gating means, a first counter being adapted to count the number of comparison signals in each series which are of the first logic level and a second counter being adapted to count the number of comparison signals in each series which are of the second logic level, and means for generating an output which is a first or second logic level according to whether a count recorded by the first counter is greater than or smaller than the associated count recorded by the other counter by a predetermined number, the outputs of the first or second logic level forming the said output signal having a periodic component whose period is equal to half the period of a periodic component in the input signal.

5. A device as claimed in claim 3 or 4, wherein the autocorrelation means further comprise a second series of stages having an associated means which generate a series of comparison signals and an associated means for generating sums of comparison signals, an input to said second series of stages being connected to an output of the generating means associated with the first series of stages, whereby there is generated at the output of the generating means associated with the second series of stages an output having a periodic component whose period is equal to one quarter of the period of a periodic component in the input signal.

6. A device as claimed in claims 3 or 4, including additionally means for determining the period of the periodic component in the signal at the otuput of the means for generating.

7. A device as claimed in claim 6, including means defining an interval of time representing a predetermined range of periods, means for comparing the period of the periodic component of the output signal from the means for generating with that interval of time and generating outputs respectively representative of a period of a periodic component of the output signal from the means for generating which lies within or without the predetermined range of periods.

8. A device as claimed in claim 7, comprising means for defining a series of intervals of time each representing an associated predetermined range of periods, and means for comparing the period of the periodic component in the said output signal with each interval of time and generating outputs respectively representative of a period of a periodic component which lies within the series of ranges of periods.

9. A device as claimed in claim 7, comprising means for applying the output signal from the means for generating to divider means which are adapted to generate a series of signals each having a period equal to a predetermined multiple of the period of the periodic component in the said output signal, means for defining a series of intervals of time each representing an associated predetermined range of periods, and means for comparing the period of each signal from the divider means with the period represented by an associated one of the series of intervals of time.

10. A device as claimed in claim 7, a qualifier circuit, and means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

11. A device as claimed in claim 10, wherein delay means are provided at the output of the qualifier circuit, the output of the delay means switching to a condition representing the presence or absence of the said predetermined output signal only after the said predetermined output signal has been present or absent, respectively, for a predetermined interval of time.

12. A device as claimed in claim 5, including additionally means for determining the period of the periodic component in the signal at the output of the means for generating.

13. A device as claimed in claim 12, including means defining an interval of time representing a predetermined range of periods, means for comparing the period of the periodic component of the output signal from the means for generating with that interval of time and generating outputs respectively representative of a period of a periodic component of the output signal from the means for generating which lies within or without the predetermined range of periods.

14. A device as claimed in claim 13, comprising means for defining a series of intervals of time each representing an associated predetermined range of periods, and means for comparing the period of the periodic component in the said output signal with each interval of time and generating outputs respectively representative of a period of a periodic component which lies within the series of ranges of periods.

15. A device as claimed in claim 13, comprising means for applying the output signal from the means for generating to divider means which are adapted to generate a series of signals each having a period equal to a predetermined multiple of the period of the periodic component in the said output signal, means for defining a series of intervals of time each representing an associated predetermined range of periods, and means for comparing the period of each signal from the divider means with the period represented by an associated one of the series of intervals of time.

16. A device as claimed in claim 13, comprising a qualifier circuit, and means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

17. A device as claimed in claim 16, wherein delay means are provided at the output of the qualifier circuit, the output of the delay means switching to a condition representing the presence or absence of the said predetermined output signal only after the said predetermined output signal has been present or absent, respectively, for a predetermined interval of time.

18. A device as claimed in 8, comprising a qualifier circuit, and means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

19. A device as claimed in claim 18, wherein delay means are provided at the output of the qualifier circuit, the output of the delay means switching to a condition representing the presence or absence of the said predetermined output signal only after the said predetermined output signal has been present or absent, respectively, for a predetermined interval of time.

20. A device as claimed in claims 1 or 2, wherein the autocorrelation means further comprise a second series of stages having an associated means which generate series of comparison signals and an associated means for generating sums of comparison signals, an input to said second series of stages being connected to an output of the generating means associated with the first series of stages, whereby there is generated at the output of the generating means associated with the second series of stages an output having a periodic component whose period is equal to one quarter of the period of a periodic component in the input signal.

21. A device as claimed in claims 1 or 2, including additionally means for determining the period of the periodic component in the signal at the output of said means for generating.

22. A device and means for determining as claimed in claim 21, including means defining an interval of time representing a predetermined range of periods, means for comparing the period of the periodic component of the output signal from the means for generating with that interval of time and generating outputs respectively representative of a period of a periodic component of the output signal from the means for generating which lies within or without the predetermined range of periods.

23. A device as claimed in claim 22, comprising means for defining a series of intervals of time each representing an associated predetermined range of periods, and means for comparing the period of the periodic component in the said output signal with each interval of time and generating outputs respectively representative of a period of a periodic component which lies within the series of ranges of periods.

24. A device as claimed in claim 22, comprising means for applying the output signal from said means for generating to divider means which are adapted to generate a series of signals each having a period equal to a predetermined multiple of the period of the periodic component in the said output signal, means for defining a series of intervals of time each representing an associated predetermined range of periods, and means for comparing the period of each signal from the divider means with the period represented by an associated one of the series of intervals of time.

25. A device as claimed in claim 22, comprising a qualifier circuit, and means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

26. A device as claimed in claim 25, wherein delay means are provided at the output of the qualifier circuit, the output of the delay means switching to a condition representing the presence or absence of the said predetermined output signal only after the said predetermined output signal has been present or absence, respectively, for a predetermined interval.

27. A device as claimed in claim 23, including a qualifier circuit, and means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

28. A device as claimed in claim 27, wherein delay means are provided at the output of the qualifier circuit, the output of the delay means switching to a condition representing the presence or absence of the said predetermined output signal only after the said predetermined output signal has been present or absence, respectively, for a predetermined interval of time.

29. A device as claimed in claim 24, including a qualifier circuit means for applying outputs of the comparator means to the qualifier circuit, the qualifier circuit being adapted to produce a predetermined output signal only if a first predetermined number of successive outputs applied to the qualifier circuit from the comparator means include at least a second predetermined number of predetermined outputs.

30. A device as claimed in claim 29, wherein delay means are provided at the output of the qualifier circuit, the output of the delay means switching to a condition representing the presence or absence of the said predetermined output signal only after the said predetermined output signal has been present or absent, respectively, for a predetermined interval of time.

31. A device for generating an electrical signal having a periodic component representative of a periodic component of an electrical input signal and containing fewer non-periodic components than the electrical input signal, the device comprising an amplitude limiter which, when the electrical input signal is applied thereto, generates a signal whose amplitude assumes one of two predetermined logic levels, a shift register, the shift register having a series of stages for storing information in the form of either one of the two logic levels, means for applying the signal from the amplitude limiter to an input to a first of the stages in the shift register, means for periodically causing the logic level of the signal at the input to said first stage to enter that stage and advancing the logic level in each stage to a respective next succeeding stage, gating means having a pair of inputs connected to respective stages in each of a series of pairs of associated stages, the two stages in each pair of associated stages being equidistantly spaced from a predetermined position in the register, multiplexer means for successively applying to one input of the gating means the logic level stored in a first of each pair of associated stages and for successively applying to the other input of the gating means the logic level stored in a second of each pair of associated stages, whereby, there is generated at the output of the gating means a comparison signal in the form of a first logic level if the logic levels in a pair of associated stages are the same and a comparison signal in the form of a second logic level if the logic levels in a pair of associated stages are different, two counters each having an input connected to an output of the gating means, a first counter being adapted to count the number of comparison signals in each series which are of the first logic level and a second counter being adapted to count the number of comparison signals in each series which are of the second logic level, and means for generating an output which is a first or second logic level according to whether a count recorded by the first counter is greater than or smaller than the associated count recorded by the other counter by a predetermined number, the outputs of the first or second logic level forming an output signal having a periodic component whose period is equal to half the period of a periodic component in the input signal.

* * * * *

UNITED STATES PATENT AND TRADEMARK OFFICE
CERTIFICATE OF CORRECTION

PATENT NO. : 4,319,334
DATED : March 9, 1982
INVENTOR(S) : George W. GURRY

It is certified that error appears in the above-identified patent and that said Letters Patent are hereby corrected as shown below:

Please add to the first page of the patent:

--[73] Assignee: Bertram Frederick McCarthy, a part interest --.

Signed and Sealed this

Twenty-first Day of December 1982

[SEAL]

Attest:

GERALD J. MOSSINGHOFF

Attesting Officer

Commissioner of Patents and Trademarks